United States Patent
Ma et al.

(10) Patent No.: US 10,317,587 B2
(45) Date of Patent: Jun. 11, 2019

(54) FABRICATION METHOD OF COLOR FILTER SUBSTRATE, COLOR FILTER SUBSTRATE AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Tao Ma, Beijing (CN); Chengshao Yang, Beijing (CN); Ling Han, Beijing (CN); Ronghua Jin, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 272 days.

(21) Appl. No.: 15/344,098

(22) Filed: Nov. 4, 2016

(65) Prior Publication Data
US 2017/0219748 A1   Aug. 3, 2017

(30) Foreign Application Priority Data
Feb. 1, 2016   (CN) .......................... 2016 1 0069573

(51) Int. Cl.
*G02B 5/22* (2006.01)
*G02B 5/20* (2006.01)
(Continued)

(52) U.S. Cl.
CPC ......... *G02B 5/201* (2013.01); *G02F 1/13338* (2013.01); *G06F 3/0412* (2013.01);
(Continued)

(58) Field of Classification Search
CPC ........ G02B 5/201; G02B 5/223; G02B 5/208; G02B 5/20; G02B 5/22; G02B 5/003;
(Continued)

(56) References Cited

U.S. PATENT DOCUMENTS

2001/0026347 A1   10/2001   Sawasaki et al.

FOREIGN PATENT DOCUMENTS

| CN | 1637503 A | 7/2005 |
| CN | 101441347 A | 5/2009 |

(Continued)

OTHER PUBLICATIONS

Jun. 20, 2016—(CN)—First Office Action Appn 201610069573.9 with English Tran.
(Continued)

*Primary Examiner* — William R Alexander
*Assistant Examiner* — Tamara Y. Washington
(74) *Attorney, Agent, or Firm* — Banner & Witcoff, Ltd.

(57) ABSTRACT

A fabrication method of a color filter substrate, a color filter substrate and a display device are provided. The fabrication method includes forming an interlayer insulating layer and a first color filter group above the conductive pattern, wherein, the first color filter group includes color filter(s) of at least one color, the interlayer insulating layer and the first color filter group are formed by a same material; the interlayer insulating layer is configured to electrically insulate the conductive connecting portion from the conductive bridging portion.

20 Claims, 5 Drawing Sheets

(51) Int. Cl.
*G06F 3/041* (2006.01)
*G02F 1/1333* (2006.01)
*G06F 3/044* (2006.01)
*H01L 27/32* (2006.01)
*G02F 1/1335* (2006.01)

(52) U.S. Cl.
CPC .. *G02F 1/133514* (2013.01); *G02F 2201/122* (2013.01); *G06F 3/044* (2013.01); *G06F 3/0416* (2013.01); *G06F 2203/04103* (2013.01); *G06F 2203/04111* (2013.01); *H01L 27/322* (2013.01); *H01L 27/323* (2013.01)

(58) Field of Classification Search
CPC ......... G02F 1/133514; G02F 1/133516; G02F 1/133512; G02F 1/136286; H01L 27/322; H01L 51/5284; H01L 27/1225
USPC .................................. 359/491.01, 890, 242
See application file for complete search history.

(56) References Cited

FOREIGN PATENT DOCUMENTS

| | | | |
|---|---|---|---|
| CN | 101889221 A | | 11/2010 |
| CN | 101943970 A | * | 1/2011 |
| CN | 103487971 A | | 1/2014 |
| CN | 103676294 A | | 3/2014 |
| CN | 203519969 U | | 4/2014 |
| CN | 103926738 A | | 7/2014 |
| CN | 103676294 B | * | 2/2016 ....... G02F 1/136209 |
| JP | 2003014917 A | | 1/2003 |

OTHER PUBLICATIONS

Sep. 23, 2016—(CN)—Second Office Action Appn 201610069573.9 with English Tran.

* cited by examiner

```
┌─────────────────────────────────────────┐
│ Forming a pattern of a black matrix on a base │
│     substrate by a patterning process         │
└─────────────────────────────────────────┘
                    │
                    ▼
┌─────────────────────────────────────────┐
│  Forming a patterns including a plurality of first │
│  electrode blocks, a plurality of second electrode │
│   blocks and connecting portions for connecting two │
│         adjacent first electrode blocks        │
└─────────────────────────────────────────┘
                    │
                    ▼
┌─────────────────────────────────────────┐
│  Forming a pattern including a red filter and an  │
│   interlayer insulating layers respectively located │
│   above the connecting portions by a patterning    │
│                   process                          │
└─────────────────────────────────────────┘
                    │
                    ▼
┌─────────────────────────────────────────┐
│  Forming a pattern including a green filter and a │
│ second sub interlayer insulating layers respectively │
│   located above the first sub interlayer insulating │
│         layers by a patterning process         │
└─────────────────────────────────────────┘
                    │
                    ▼
┌─────────────────────────────────────────┐
│   Forming a pattern of bridging portions for   │
│  bridging every two adjacent second electrode  │
│  blocks located in a same row by a patterning  │
│                   process                      │
└─────────────────────────────────────────┘
                    │
                    ▼
┌─────────────────────────────────────────┐
│  Forming a pattern including a blue filter by a │
│              patterning process                 │
└─────────────────────────────────────────┘
```

FIG. 2

FABRICATION METHOD OF COLOR FILTER SUBSTRATE, COLOR FILTER SUBSTRATE AND DISPLAY DEVICE

This application claims priority to and the benefit of Chinese Patent Application No. 201610069573.9 filed on Feb. 1, 2016, which application is incorporated herein in its entirety.

TECHNICAL FIELD

Embodiments of the present disclosure relate to a fabrication method of a color filter substrate, a color filter substrate and a display device.

BACKGROUND

A display screen (touch screen) having a touch function has been more and more widely used. And a capacitive touch screen is an important form of the touch screen. The capacitive touch screen is provided with a plurality of driving electrodes and sensing electrodes intersecting with each other, and a capacitance is formed in an adjacent position of the two types of electrodes; the respective driving electrodes load driving signals in a manner of scanning, and the sensing electrodes accordingly generate sensing signals; and when there is a touch, a human body or a touch pen gets close to a touch region, the capacitance between the two types of electrodes in the region is affected, the sensing signals of the corresponding sensing electrodes are changed, so that a touch position can be determined.

SUMMARY

An embodiment of the present disclosure provides a fabrication method of a color filter substrate, including: forming a conductive pattern above an upper surface of a base substrate, the conductive pattern including two first electrode blocks arranged in a first direction, two second electrode blocks arranged in a second direction intersecting with the first direction, and a conductive connecting portion for connecting the two first electrode blocks; forming an interlayer insulating layer and a first color filter group above the conductive pattern, wherein, the first color filter group includes color filter(s) of at least one color, the interlayer insulating layer and the first color filter group are formed by a same material; and forming a conductive bridging portion for connecting the two second electrode blocks above the interlayer insulating layer, wherein, the interlayer insulating layer is configured to electrically insulate the conductive connecting portion from the conductive bridging portion.

Another embodiment of the present disclosure provides a color filter substrate, including: a base substrate; a conductive pattern located above an upper surface of the base substrate, including two first electrode blocks arranged in a first direction, two second electrode blocks arranged in a second direction intersecting with the first direction, and a conductive connecting portion for connecting the two first electrode blocks; an interlayer insulating layer and a first color filter group located above the conductive pattern, wherein, the first color filter group includes color filter(s) of at least one color, the interlayer insulating layer and the first color filter group are formed by a same material; and a conductive bridging portion located above the interlayer insulating layer and configured for connecting the two second electrode blocks, wherein, the interlayer insulating layer is configured to electrically insulate the conductive connecting portion from the conductive bridging portion.

Yet another embodiment of the present disclosure provides a display device, including the color filter substrate described above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the disclosure.

FIG. 2 is a flowchart of a second implementation mode of the fabrication method of the color filter substrate of Embodiment 1 of the present disclosure;

DETAILED DESCRIPTION

Figure 1:
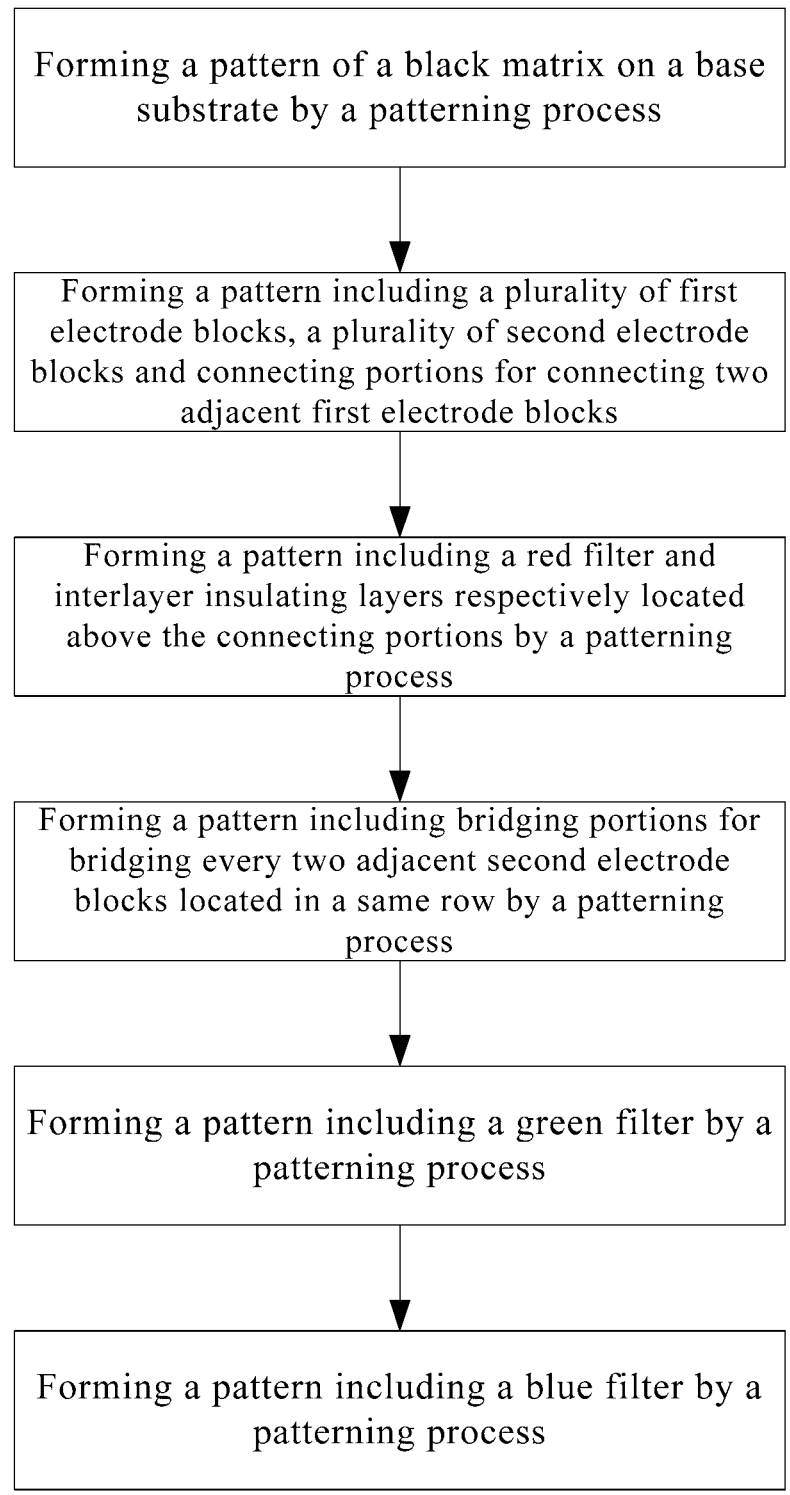
FIG. 1 is a flowchart of a first implementation mode of a fabrication method of a color filter substrate of Embodiment 1 of the present disclosure.

In a structure of a related capacitive touch screen, driving electrodes include first electrode blocks arranged in a row, sensing electrodes include second electrode blocks arranged in a same layer with the first electrode blocks, and a connecting portion for connecting two adjacent second electrode blocks. An interlayer insulating layer is arranged above the connecting portion, a bridging portion is arranged above the interlayer insulating layer and used for connecting two adjacent second electrode blocks. But the inventors have found that the interlayer insulating layer arranged between the bridging portion and the connecting portion needs to be prepared by a separate preparation process, resulting in high process cost.

As for the above problems in the related capacitive touch screen, embodiments of the present disclosure provide a fabrication method of a color filter substrate, a color filter substrate and a display device, which are simple in process and low in cost.

The technical solutions of the embodiments of the present disclosure will be described in a clearly and fully understandable way in connection with the drawings. It is obvious that the described embodiments are just a part but not all of the embodiments of the present disclosure. Based on the described embodiments herein, those skilled in the art can obtain other embodiment(s), without any inventive work, which should be within the scope of the present disclosure.

Embodiment 1

In conjunction with what are shown in FIGS. 1 to 7, the embodiment provides a fabrication method of a color filter substrate, including steps of preparing a plurality of driving electrode rows and a plurality of sensing electrode columns, wherein, each of the driving electrode rows and each of sensing electrode columns intersect with each other; each of the sensing electrode columns includes a plurality of first sensing electrode blocks 1 (i.e., the first electrode blocks 1 are sensing electrode blocks), and a conductive connecting portions 11 for connecting every two adjacent first electrode blocks 1; and each of the driving electrode rows includes a plurality of second electrode blocks (i.e., the second electrode blocks 2 are driving electrode blocks), and a conductive bridging portion 21 for bridging two adjacent second electrode blocks 2. Here, for example, the plurality of first electrode blocks 1 and the plurality of second electrode blocks 2 as well as the connecting portion 11 for connecting the two adjacent first electrode blocks 1 are located in a same layer, and the bridging portion 21 for bridging the two adjacent second electrode blocks 2 is located in another layer. Of course, in another embodiment, it may also be that, the two adjacent second electrode blocks 2 are connected by a connecting portion located in a same layer, and the two adjacent first electrode blocks 1 are connected by a bridging portion located in different layers.

In the fabrication method of the color filter substrate in the present disclosure, an interlayer insulating layer between the connecting portion and the bridging portion can be also formed together with a color filter of at least one color synchronously, so that process steps and production cost can be reduced.

Here, the fabrication method of the embodiment is described by only taking an example that the two adjacent first electrode blocks 1 are connected by the connecting portion 11 and the two adjacent second electrode blocks 2 are connected by the bridging portion 21.

The color filter substrate, for example, includes color filters of N different colors; color filters of M different colors are formed while the interlayer insulating layer is formed; a protruding portion is formed above a bridging portion 21 after the bridging portion 21 is formed, and color filters of other K different colors are formed while the protruding portion is formed; where, M+K=N. Here, M, K and N are nonzero integers, for example, N≥3, M≥1, and K≥1. In the embodiment, it is described by taking an example of N=3, K=1 or 2, color filters of three different colors are a red filter 5, a green filter 6 and a blue filter, respectively. However, it is not limitative to the embodiment, and they may also be color filters of other colors or more colors.

Figure 5:
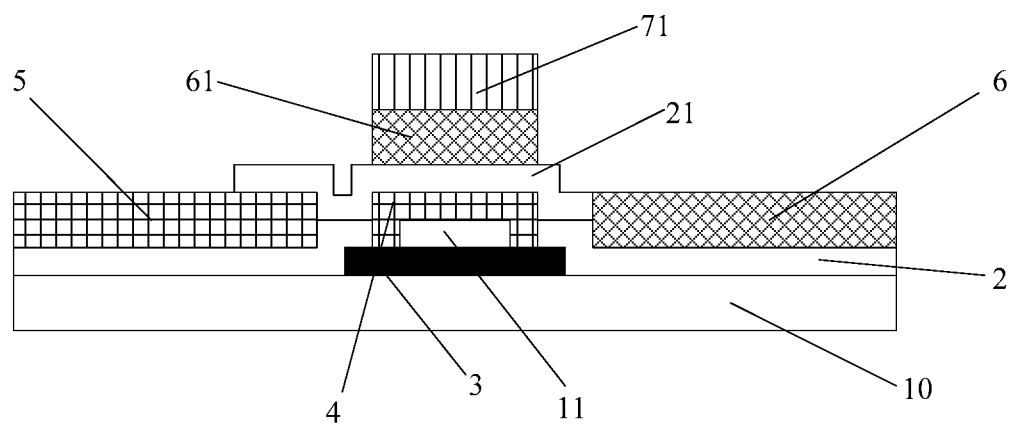
FIG. 5 is an A-A cross-sectional view of a first structure of FIG. 4.

As a first implementation mode of the embodiment, as shown in conjunction with FIGS. 1 and 5, the fabrication method of the color filter substrate, for example, including steps of:

Step 1: forming a pattern of a black matrix 3 on a base substrate 10 by a patterning process, the pattern of the black matrix 3 defining a plurality of pixel regions on the color filter substrate.

Step 2: forming a first transparent electrode layer (ITO) on the base substrate 10 where step 1 has been completed, and forming a pattern including a plurality of first electrode blocks 1, a plurality of second electrode blocks 2 and connecting portions 11 for connecting two adjacent first electrode blocks 1; wherein, the plurality of first electrode blocks 1 are arranged in columns. A sensing electrode is formed by the first electrode blocks 1 located in a same column and the connecting portions 11 connecting the first electrode blocks 1 located in the same column. Since the respective connecting portions 11 are located above the black matrix 3, display may be not affected.

Step 3: depositing a first color resisting layer (e.g., a red color filter layer) on the base substrate 10 where step 2 has been completed, and forming a pattern including a red filter 5 and an interlayer insulating layer 4 located above the respective connecting portions 11 by a patterning process. Thus, the interlayer insulating layer 4 and the red color filter 5 are located in a same layer. The formed interlayer insulating layer 4 is disconnected from the red filter 5 adjacent thereto, and the second electrode block 2 is exposed at a disconnected position. It should be noted here that, the second electrode block 2 does not need to be completely exposed, so long as it is partly exposed.

Step 4: forming a second transparent conductive layer on the base substrate 10 where step 3 has been completed, and forming a pattern including bridging portions 21 for bridging every two adjacent second electrode blocks 2 located in a same row by a patterning process. So far, preparations of the driving electrodes and the sensing electrodes are completed.

Step 5: depositing a second color resisting layer (e.g., a green color filter layer) on the base substrate 10 where step 4 has been completed, and forming a pattern including a green filter 6 by a patterning process.

Step 6: depositing a third color resisting layer (e.g., a blue color filter layer) on the base substrate 10 where step 5 has been completed, and forming a pattern including a blue filter by a patterning process.

In summary, the interlayer insulating layer 4 between the connecting portion 11 and the bridging portion 21 are synchronously formed with the red color filter 5, so that process steps may be saved and production cost may be reduced.

In the fabrication method, for example, with reference to FIG. 5, first protruding portions 61 above the respective bridging portions 21 can be formed together with the green filter 6 when patterning the second color resisting layer in step 5, and thus the green filter 6 and the first protruding portion 61 are located in a same layer. The green filter 6 and the first protruding portion 61 are arranged apart from each other. A second protruding portion 71 above the first protruding portion 61 can be formed together with the blue filter when patterning the third color resisting layer in step 6, and thus the blue filter and the second protruding portion 71 are located in a same layer. The blue filter and the second protruding portion 71 are arranged apart from each other. In a direction perpendicular to an upper surface of the base substrate 10, the interlayer insulating layer 4, the first protruding portion 61 and the second protruding portion 71 are stacked sequentially. That is, vertical projections of the interlayer insulating layer 4, the first protruding portion 61 and the second protruding portion 71 on the upper surface of the base substrate 10 overlap with each other. In this case, a sum of thicknesses of the first protruding portion 61 and the second protruding portion 71 and the interlayer insulating layer 4 may exactly meet a need of a height of a spacing pillar, and therefore, it is not necessary to prepare the spacing pillar separately in the method, so that a further process step may be saved and production cost may be reduced. It should be understood that, the interlayer insulating layer 4 and the red filter 5 are made of a same material, so that the interlayer insulating layer is red; the first protruding portion 61 and the green filter 6 are made of a same material, so that the first protruding portion 61 is green; the second protruding portion 71 and the blue filter are made of a same material, so that the second protruding portion 71 is blue; Thus, the interlayer insulating layer 4, the first protruding portion 61 and the second protruding portion 71 sequentially located above the connecting portion 11 are superimposed, which is equivalent to superimpose the red, green and blue filters on this position, so that light transmittance at the position is very low. In an example, the black matrix 3 may be omitted below the connecting portion 11, thereby saving a further process step and reducing production cost. Of course, light leakage may be better avoided by reserving the black matrix 3.

It should be noted here that, in another implementation mode of the embodiment, the interlayer insulating layer may be synchronously formed with the green filter 6 or the blue filter, and a corresponding method is similar to the method described above, which will be not described here in detail.

Figure 6:
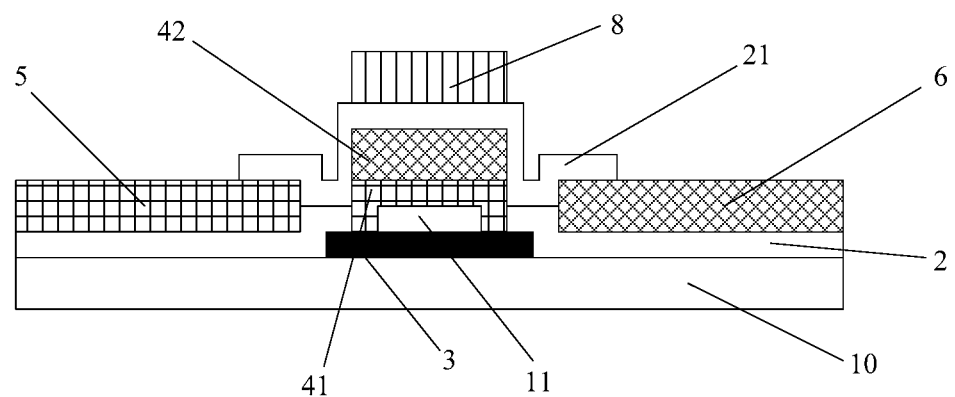
FIG. 6 is an A-A cross-sectional view of a second structure of FIG. 4.

As a second implementation mode of the embodiment, as shown in conjunction with FIGS. 2 and 6, the fabrication method of the color filter substrate, for example, including steps of:

Step 1: forming a pattern of a black matrix 3 on a base substrate 10 by a patterning process, the pattern of the black matrix 3 defining a plurality of pixel regions on the color filter substrate.

Step 2: forming a first transparent electrode layer (ITO) on the base substrate 10 where step 1 has been completed, and forming a pattern including a plurality of first electrode blocks 1, a plurality of second electrode blocks 2 and connecting portions 11 for connecting two adjacent first electrode blocks 1; wherein, the plurality of first electrode blocks are arranged in columns, and a sensing electrode is formed by the first electrode blocks 1 located in a same column and the connecting portions 11 for connecting the first electrode blocks 1 located in the same column. Since the respective connecting portions 11 are located above the black matrix 3, display may be not affected.

Step 3: depositing a first color resisting layer (e.g., a red color filter layer) on the base substrate 10 where step 2 has been completed, and forming a pattern including a red filter 5 and a first sub interlayer insulating layer 41 (a first sub layer structure of the interlayer insulating layer 4) located above each of the connecting portions 11 by a patterning process. Thus, the first sub interlayer insulating layer 41 and the red filter 5 are located in a same layer, wherein, the formed first sub interlayer insulating layer 41 is disconnected from the red filter 5 adjacent thereto, and the second electrode block 2 is exposed at a disconnected position. It should be noted here that, the second electrode block 2 does not need to be completely exposed, so long as it is partly exposed.

Step 4: depositing a second color resisting layer (e.g., a green filter layer) on the base substrate 10 where step 3 has been completed, and forming a pattern including a green filter 6 and a second sub interlayer insulating layer 42 (a second sub layer structure of the interlayer insulating layer 4) located above each of the first sub interlayer insulating layers 41 by a patterning process. Thus, the second sub interlayer insulating layer 42 and the green filter 6 are located in a same layer, wherein the formed second sub interlayer insulating layer 42 is disconnected from the green filter 6 and the red filter 5, and the second electrode block 2 is exposed at the disconnected position. It should be noted here that, the second electrode block 2 does not need to be completely exposed, so long as it is partly exposed.

Step 5: forming a second transparent conductive layer on the base substrate 10 where step 4 has been completed, and forming a pattern of bridging portions 21 for bridging every two adjacent second electrode blocks 2 located in a same row by a patterning process. So far, preparations of the driving electrode and the sensing electrode are completed.

Step 6: depositing a third color resisting layer (e.g., a blue color filter layer) on the base substrate 10 where step 5 has been completed, and forming a pattern including a blue filter by a patterning process.

In summary, the interlayer insulating layer 4 (including the first sub interlayer insulating layer 41 and the second sub interlayer insulating layer 42) between the connecting portion 11 and the bridging portion 21 are formed with the red color filter 5 and the green filter 6 synchronously, so that a process step can be saved and production cost may be reduced.

In the fabrication method, a protruding portion 8 above the interlayer insulating layer 4 is formed together with the blue filter by the patterning the third color resisting layer in step 6. Thus, the protruding portion 8 and the blue filter are located in a same layer. With reference to FIG. 6, the first sub interlayer insulating layer 41 and the second sub interlayer insulating layer 42 as well as the protruding portion 8 are arranged sequentially in a direction perpendicular to an upper surface of the substrate 10, that is, vertical projections of the first sub interlayer insulating layer 41 and the second sub interlayer insulating layer 42 as well as the protruding portion 8 on the base substrate 10 overlap with each other. In this case, a sum of thicknesses of the protruding portion 8 and the first sub interlayer insulating layer 41 and the second sub interlayer insulating layer 42 may exactly meet a need of a height of a spacing pillar. Therefore, it is not necessary to prepare the spacing pillar separately in the method, so that a further process step may be saved and production cost may be reduced. It should be understood that, the first sub interlayer insulating layer 41 and the red filter 5 are made of a same material, so that the first sub interlayer insulating layer 41 is red; the second sub interlayer insulating layer 42 and the green filter 6 are made of a same material, so that the second sub interlayer insulating layer 42 is green; the protruding portion 8 and the blue filter are made of a same material, so that the protruding portion 8 is blue. Thus, the first sub interlayer insulating layer 41, the second sub interlayer insulating layer 42 and the protruding portion 8 sequentially located above the connecting portion 11 are superimposed, which is equivalent to superimpose the red, green and blue filters on this position, so that light transmittance at the position is very low, and the black matrix 3 may be not arranged below the connecting portion 11, thereby saving a further process step and reducing production cost, and of course, the black matrix 3 may be also arranged, which may maximally avoid light leakage.

It should be noted here that, in another implementation mode of the embodiment, the interlayer insulating layer may be formed with the green filter and blue filters or the blue filter and red filter 5 synchronously, and corresponding method is similar to the method described above, which will be not described here in detail.

Figure 3:
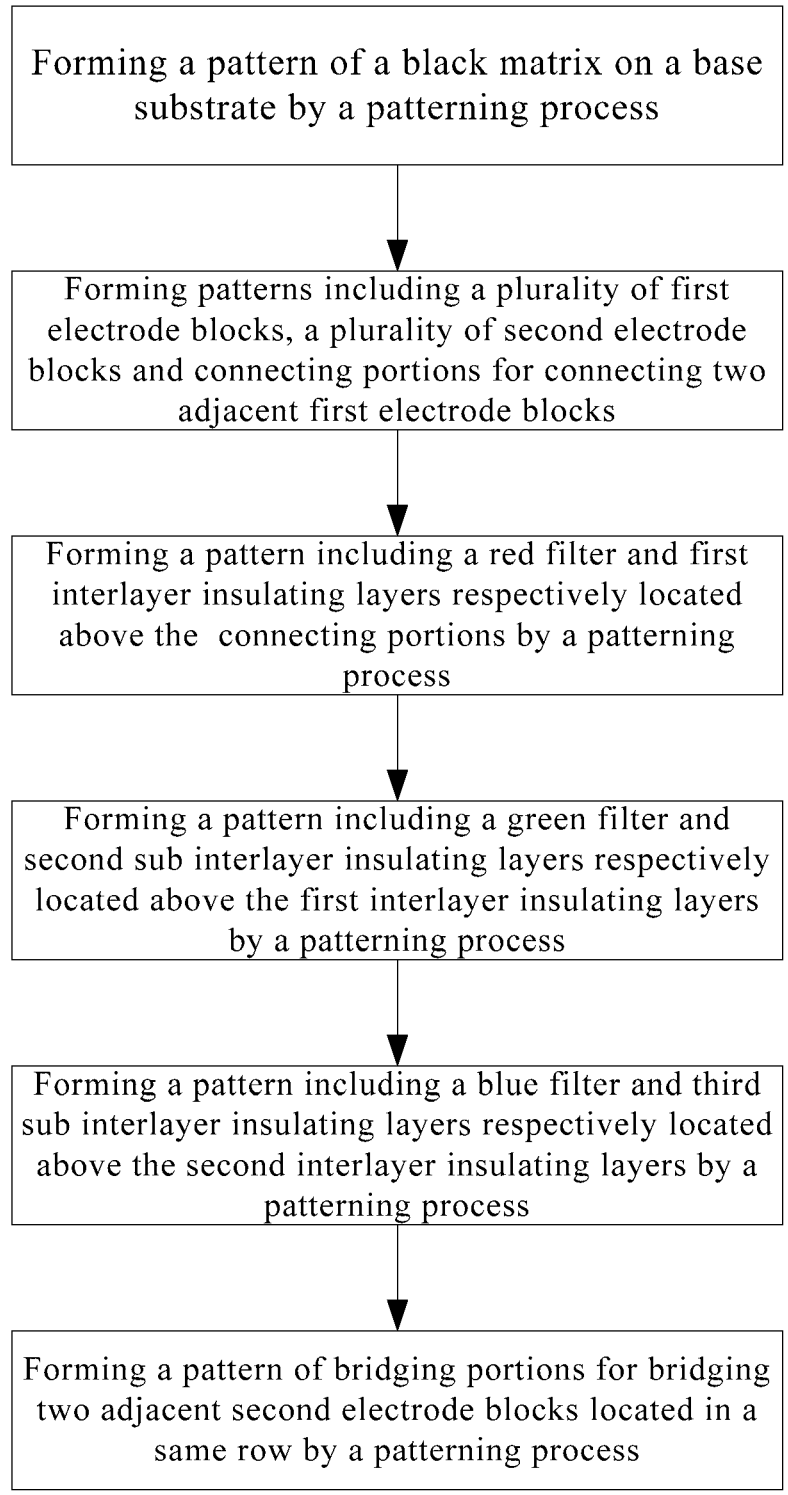
FIG. 3 is a flowchart of a third implementation mode of the fabrication method of the color filter substrate of Embodiment 1 of the present disclosure.
Figure 4:
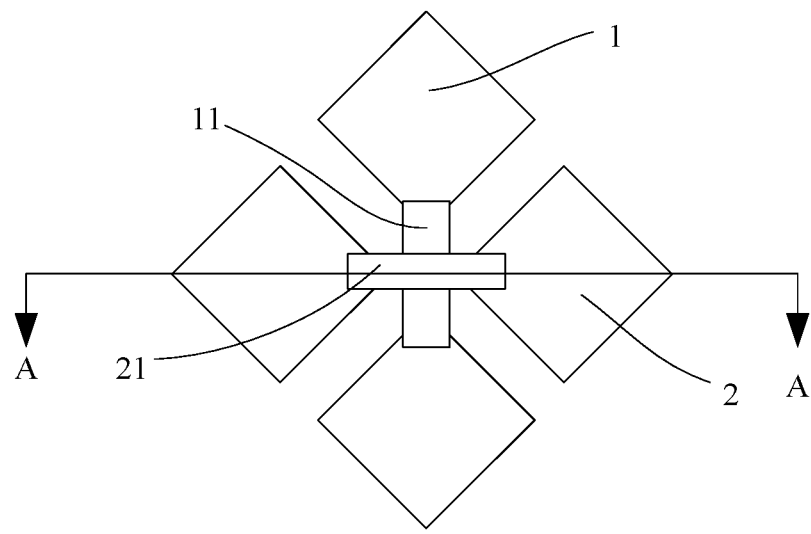
FIG. 4 is a structural schematic diagram of a color filter substrate of Embodiments 1 and 2 of the present disclosure.
Figure 7:
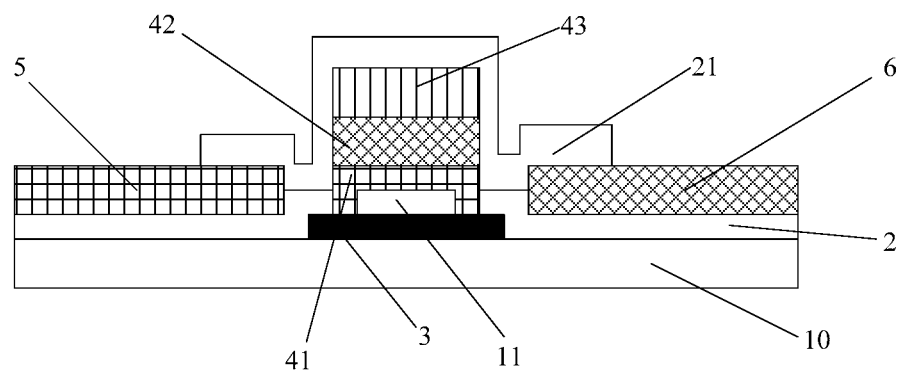
FIG. 7 is an A-A cross-sectional view of a third structure of FIG. 4.

As a third implementation mode of the embodiment, as shown in conjunction with FIGS. 3 and 7, the fabrication method of the color filter substrate, for example, including steps of:

Step 1: forming a pattern of a black matrix 3 on a base substrate 10 by a patterning process, the pattern of the black matrix 3 defining a plurality of pixel regions on the color filter substrate.

Step 2: forming a first transparent electrode layer (ITO) on the base substrate 10 where step 1 has been completed, and forming patterns including a plurality of first electrode blocks 1, a plurality of second electrode blocks 2 and connecting portions 11 for connecting two adjacent first electrode blocks 1; wherein, the plurality of first electrode blocks are arranged in columns, and a sensing electrode is formed by the first electrode blocks 1 located in a same column and the connecting portions 11 for connecting the first electrode blocks 1 located in the same column. Since each connecting portion 11 is located above the black matrix 3, display may be not affected.

Step 3: depositing a first color resisting layer (e.g., a red color filter layer) on the base substrate 10 where step 2 has been completed, and forming a pattern including a red filter 5 and first sub interlayer insulating layers 41 (first sub layer structure of the interlayer insulating layer 4) respectively located above the connecting portions 11 by a patterning process. Thus, the first sub interlayer insulating layers 41 and the red filter 5 are located in a same layer, wherein, the formed first sub interlayer insulating layers 41 are disconnected from the red filter 5 adjacent thereto, and the second electrode block 2 is exposed at a disconnected position, and it should be noted here that, the second electrode block 2 does not need to be completely exposed, so long as it is partly exposed.

Step 4: depositing a second color resisting layer (e.g., a green filter layer) on the base substrate 10 where step 3 has been completed, and forming a pattern including a green filter 6 and a second sub interlayer insulating layers 42 (second sub layer structure of the interlayer insulating layer 4) respectively located above the first sub interlayer insulating layers 41 by a patterning process. Thus, the second sub interlayer insulating layers 42 and the green filter 6 are located in a same layer, wherein, the formed second sub interlayer insulating layer 42 are disconnected from the green filter 6 and the red filter 5, and the second electrode block 2 is exposed at the disconnected position, and it should be noted here that, the second electrode block 2 does not need to be completely exposed, so long as it is partly exposed.

Step 5: depositing a third color resisting layer (e.g., a blue filter layer) on the base substrate 10 where step 4 has been completed, and forming a pattern including a blue filter and third sub interlayer insulating layers 43 (third sub layer structure of the interlayer insulating layer 4) respectively located above the second sub interlayer insulating layers 42 by a patterning process. Thus, the third sub interlayer insulating layers 43 and the blue filter are located in a same layer, wherein, the formed third sub interlayer insulating layer 43 are disconnected from the green filter 6, the red filter 5 and the blue filter, and the second electrode block 2 is exposed at the disconnected position; and it should be noted here that, the second electrode block 2 does not need to be completely exposed, so long as it is partly exposed.

Step 6: forming a second transparent conductive layer on the base substrate 10 where step 5 has been completed, and forming a pattern of bridging portions 21 for bridging every two adjacent second electrode blocks 2 located in a same row by a patterning process. So far, preparations of the driving electrode and the sensing electrode are completed.

In conclusion, the interlayer insulating layer between the connecting portion 11 and the bridging portion 21 is formed with the red color filter 5 and the green filter 6 as well as the blue filter synchronously, so that a process step may be saved and production cost may be reduced.

In the fabrication method, a sum of thicknesses of the first sub insulating layer 41 and the second sub insulating layer 42 and the third sub interlayer insulating layer 43 may exactly meet a need of a height of a spacing pillar, and therefore, it is not necessary to prepare the spacing pillar separately in the method, so that a further process step may be saved and production cost may be reduced. It should be understood that, the first sub interlayer insulating layer 41 and the red filter 5 are made of a same material, so that the first sub interlayer insulating layer 41 is red; the second sub interlayer insulating layer 42 and the green filter 6 are made of a same material, so that the second sub interlayer insulating layer 42 is green; the third sub interlayer insulating layer 43 and the blue filter are made of a same material, so that the third sub interlayer insulating layer 43 is blue, and thus the first sub interlayer insulating layer 41, the second sub interlayer insulating layer 42 and the third sub interlayer insulating layer 43 sequentially located above the connecting portion 11 are superimposed, which is equivalent to superimpose the red, green and blue filters on here, so that light transmittance at the position is very low, and it is not necessary to arrange the black matrix 3 below the connecting portion 11, thereby saving a further process step and reducing production cost, and of course, the black matrix 3 may be also arranged, which may better avoid light leakage.

Embodiment 2

In conjunction with what are shown in FIGS. 4 to 7, the embodiment provides a color filter substrate, including a plurality of driving electrode rows and a plurality of sensing electrode columns, wherein, the driving electrode rows intersect with the sensing electrode columns; each of the driving electrode rows includes a plurality of first electrode blocks 1, and conductive connecting portions 11 for connecting two adjacent first electrode blocks 1; and each of the driving electrode columns includes a plurality of second electrode blocks 2, and conductive bridging portions 21 for bridging two adjacent second electrode blocks 2. In another example, it may also be that, the two adjacent second electrode blocks 2 are connected by a connecting portion 11, and the two adjacent first electrode blocks 1 are connected by a bridging portion 21. In the embodiment, the fabrication method of the embodiment is described by only taking an example that the two adjacent first electrode blocks 1 are connected by the connecting portion 11 and the two adjacent second electrode blocks 2 are connected by the bridging portion 21.

Herein, the color filter substrate includes color filters of N different colors; color filters of M different colors are formed while the interlayer insulating layer is formed; a protruding portion is formed above a bridging portion after the bridging portion is formed, and color filters of other K different colors are formed while the protruding portion is formed; wherein, M+K=N. In the embodiment, it is described by taking an example of N=3, K=1 or 2; color filters of three different colors are a red filter 5, a green filter 6 and a blue filter, respectively. However, it is not limitative to the embodiment, and they may also be color filters of other colors or more colors.

As a first structure of the embodiment, as shown in FIG. 5, the color filter substrate, for example, includes parts of:
a base substrate 10,
a black matrix 3 arranged on the base substrate 10, the black matrix 3 defining a plurality of pixel regions.
a plurality of first electrode blocks 1, a plurality of second electrode blocks 2, and a connecting portion 11 for connecting two adjacent first electrode blocks 1, located in a same layer and arranged above a layer where the black matrix 3 is located; wherein, the plurality of first electrode blocks 1 are arranged in columns, and a sensing electrode is formed by the first electrode blocks 1 located in a same column and the connecting portions 11 for connecting the first electrode blocks 1 located in the same column. Since each connecting portion 11 is located above the black matrix 3, display may be not affected.

a red filter 5 and an interlayer insulating layer 4, arranged above a layer where the plurality of first electrode blocks 1, the plurality of second electrode blocks 2 and the connecting portion 11 for connecting the every two adjacent first electrode blocks 1 are located, the interlayer insulating layer 4 being located directly above the respective connecting portions 11; wherein, the formed interlayer insulating layer 4 is disconnected from the red filter 5 adjacent thereto, and the second electrode block 2 is exposed at a disconnected position. It should be noted here that, the second electrode block 2 does not need to be completely exposed, so long as it is partly exposed.

bridging portions 21, for bridging every two adjacent second electrode blocks 2 located in a same row, and arranged above a layer where the red filter 5 and the interlayer insulating layer 4 are located.

Of course, a green filter 6 and a blue filter are also included.

In summary, the interlayer insulating layer 4 between the connecting portion 11 and the bridging portion 21 and the red color filter 5 are arranged in a same layer, so that a process step may be saved and production cost may be reduced. Specific forming method is as described in the first implementation mode of Embodiment 1.

For example, a first protruding portion is located above each of the bridging portions 21, and the first protruding portion and the green filter are arranged in a same layer and made of a same material; and a second protruding portion 71 is located on the first protruding portion 61, and the second protruding portion 71 and the blue filter are arranged in a same layer and made of a same material. In this case, a sum of thicknesses of the first protruding portion 61 and the second protruding portion 71 and the interlayer insulating layer 4 may exactly meet a need of a spacing pillar, and therefore, it is not necessary to prepare the spacing pillar separately in the method, so that a process step may be saved and production cost may be reduced. It should be understood that, the interlayer insulating layer and the red filter 5 are made of a same material, so that the interlayer insulating layer is red; the first protruding portion and the green filter 6 are made of a same material, so that the first protruding portion 61 is green; the second protruding portion 71 and the blue filter are made of a same material, so that the second protruding portion 71 is blue. Thus, the interlayer insulating layer, the first protruding portion 61 and the second protruding portion 71 sequentially located above the connecting portion 11 are superimposed, which is equivalent to superimpose the red, green and blue filters on here, so that light transmittance at the position is very low, and it is not necessary to arrange the black matrix 3 below the connecting portion 11, thereby saving process steps and reducing production cost, and of course, the black matrix 3 may be also arranged, which may maximally avoid light leakage.

It should be noted here that, the expression "film layers arranging in (a) same layer" described in the embodiments refers to that the film layers are formed by using the same one mask.

Of course, the interlayer insulating layer 4 in the embodiment may be also formed with the green filter 6 or the blue filter synchronously, which will not be repeated here in detail.

As a second structure of the embodiment, as shown in FIG. 6, the color filter substrate includes parts of:

a base substrate 10, a black matrix 3 arranged above the base substrate 10, the black matrix 3 defining a plurality of pixel regions.

a plurality of first electrode blocks 1, a plurality of second electrode blocks 2 and connecting portions 11 for connecting two adjacent first electrode blocks 1, which are arranged above the layer where the black matrix 3 is located; wherein, the plurality of first electrode blocks 1 are arranged in columns, and a sensing electrode is formed by the first electrode blocks 1 located in a same column and the connecting portions 11 for connecting the first electrode blocks 1 located in the same column. And each connecting portion 11 is located above the black matrix 3, so that display may be not affected.

a red filter 5 and a first sub interlayer insulating layer 41 (a first layer structure of the interlayer insulating layer 4), arranged above a layer where the plurality of first electrode blocks 1, the plurality of second electrode blocks 2 and the connecting portion 11 for connecting the two adjacent first electrode blocks 1 are located, the first sub interlayer insulating layer 41 being located directly above the respective connecting portions 11, wherein, the formed first sub interlayer insulating layer 41 is disconnected from the red filter 5 adjacent thereto, and the second electrode block 2 is exposed at a disconnected position; and it should be noted here that, the second electrode block 2 does not need to be completely exposed, so long as it is partly exposed.

a green filter 6 and a second sub interlayer insulating layer 42 (a second layer structure of the interlayer insulating layer 4), arranged above a layer where the red filter 5 and the first sub interlayer insulating layer 41 are located, and the second sub interlayer insulating layer 42 being respectively located directly above the first sub interlayer insulating layers 41, wherein, the formed second sub interlayer insulating layer 42 is disconnected from the green filter 6 and the red filter 5, and the second electrode block 2 is exposed at the disconnected position. It should be noted here that, the second electrode block 2 does not need to be completely exposed, so long as it is partly exposed.

bridging portions 21, for bridging every two adjacent second electrode blocks 2 located in a same row, and arranged above the layer where the green filter 6 and the second sub interlayer insulating layer 42 are located. So far, preparations of the driving electrode and the sensing electrode are completed.

Of course, a blue filter is also included. The structure of the color filter in the embodiment may be prepared by using the second implementation mode of Embodiment 1.

In summary, the interlayer insulating layer 4 between the connecting portion 11 and the bridging portion 21 has a first portion 41 arranged in same layer with the red filter 5 and the second portion 42 arranged in same layer with the green filter 6, so that the interlayer insulating layer 4 may be formed with the red filter 5 and the green filter 6 synchronously by the same patterning processes, and thus a process step may be saved and production cost may be reduced.

For example, a protruding portion 8 and the blue filter are arranged in a same layer, and at this time, a sum of thicknesses of the protruding portion 8 and the first sub interlayer insulating layer 41 and the second sub interlayer insulating layer 41 may exactly meet a need of a spacing pillar, and therefore, it is not necessary to prepare the spacing pillar separately in the structure, so that process steps may be saved and production cost may be reduced. It should be understood that, the first sub interlayer insulating layer 41 and the red filter 5 are made of a same material, so that the first sub interlayer insulating layer 41 displays red; the second sub interlayer insulating layer 42 and the green filter 6 are made of a same material, so that the second sub interlayer insulating layer 42 displays green; the protruding portion 8 and the blue filter are made of a same material, so that the protruding portion 8 displays blue, and thus the first sub interlayer insulating layer 41, the second sub interlayer insulating layer 42 and the protruding portion 8 sequentially located above the connecting portion 11 are superimposed, which is equivalent to superimpose the red, green and blue filters on here, so that light transmittance at the position is very low, and it is not necessary to arrange the black matrix 3 below the connecting portion 11, thereby saving process steps, and reducing production cost, and of course, the black matrix 3 may be also arranged, which may maximally avoid light leakage.

It should be noted that, the interlayer insulating layer 4 in the embodiment may be also formed with the green filter 6 and the blue filter synchronously, or formed with the blue filter and the red filter synchronously, a principle thereof is same as that of the structure described above, which will not be described here in detail.

As a third structure of the embodiment, as shown in FIG. 7, the color filter substrate includes parts of:

a base substrate 10, a black matrix 3 arranged above the base substrate 10; and the black matrix 3 defines a plurality of pixel regions.

a plurality of first electrode blocks 1, a plurality of second electrode blocks 2 and a connecting portion 11 for connecting two adjacent first electrode blocks 1, which are arranged above a layer where the black matrix 3 is located; wherein, the plurality of first electrode blocks 1 are arranged in columns, and a sensing electrode is formed by the first electrode blocks 1 located in a same column and the connecting portion 11 for connecting the first electrode blocks 1 located in the same column. And each connecting portion 11 is located above the black matrix 3, so that display may be not affected.

a red filter 5 and a first sub interlayer insulating layer 41 (a first layer structure of the interlayer insulating layer 4), arranged above a layer where the plurality of first electrode blocks 1, the plurality of second electrode blocks 2 and the connecting portions 11 for connecting the two adjacent first electrode blocks 1 are located, the first sub interlayer insulating layer 41 being located above each of the connecting portions 11, wherein, the formed first sub interlayer insulating layer 41 is disconnected from the red filter 5 adjacent thereto, and the second electrode block 2 is exposed at a disconnected position. It should be noted here that, the second electrode block 2 does not need to be completely exposed, so long as it is partly exposed.

a green filter 6 and a second sub interlayer insulating layer 42 (a second layer structure of the interlayer insulating layer 4), arranged above a layer where the red filter 5 and the first sub interlayer insulating layer 41 are located, the green filter 6 being located directly above each of the first sub interlayer insulating layers 41, wherein, the formed second sub interlayer insulating layer 42 is disconnected from the green filter 6 and the red filter 5, and the second electrode block 2 is exposed at the disconnected position. It should be noted here that, the second electrode block 2 does not need to be completely exposed, so long as it is partly exposed.

a blue filter and a third sub interlayer insulating layer 43 (a third layer structure of the interlayer insulating layer 4), arranged above a layer where the green filter 6 and the second sub interlayer insulating layer 42 are located, the blue filter being located directly above each of the second sub interlayer insulating layers 42, wherein, the formed third sub interlayer insulating layer 43 is disconnected from the green filter 6, the red filter 5 and the blue filter, and the second electrode block 2 is exposed at a disconnected position, and it should be noted here that, the second electrode block 2 does not need to be completely exposed, so long as it is partly exposed.

bridging portions 21, for bridging every two adjacent second electrode blocks 2 located in a same row, and arranged above the layer where the blue filter and the third sub interlayer insulating layer 43 are located. The color filter in the embodiment is prepared by using the third implementation mode of Embodiment 1.

In summary, the interlayer insulating layer between the connecting portion 11 and the bridging portion 21 has the first portion 41 arranged in same layer with the red filter 5, the second portion 42 arranged in same layer with the green filter 6 and the third portion 43 arranged in same layer with the blue filter, so that the interlayer insulating layer 4 may be formed with the red filter 5, the green filter 6 and the blue filter synchronously, and thus a process step may be saved and production cost may be reduced.

In the color filter of the embodiment, a sum of thicknesses of the first sub interlayer insulating layer 41, the second sub interlayer insulating layer 42 and the third sub interlayer insulating layer 43 may exactly meet a need of a spacing pillar, and therefore, it is not necessary to prepare the spacing pillar separately in the method, so that a further process step may be saved and production cost may be reduced. It should be understood that, the first sub interlayer insulating layer 41 and the red filter 5 are made of a same material, so that the first sub interlayer insulating layer 41 is red; the second sub interlayer insulating layer 42 and the green filter 6 are made of a same material, so that the second sub interlayer insulating layer 42 is green; the third sub interlayer insulating layer 43 and the blue filter are made of a same material, so that the third sub interlayer insulating layer 43 is blue, and thus the first sub interlayer insulating layer 41, the second sub interlayer insulating layer 42 and the third sub interlayer insulating layer 43 sequentially located above the connecting portion 11 are superimposed, which is equivalent to superimpose the red, green and blue filters on here, so that light transmittance at the position is very low, and it is not necessary to arrange the black matrix 3 below the connecting portion 11, thereby saving a further process step and reducing production cost; and of course, the black matrix 3 may be also arranged, which may better avoid light leakage.

Embodiment 3

The embodiment provides a display device, including the color filter substrate provided by Embodiment 2.

One example of the display device is a liquid crystal display device, wherein, an array substrate is arranged opposite to a counter substrate to form a liquid crystal cell, and the liquid crystal cell is filled with liquid crystal material therein. A pixel electrode of each pixel unit of the array substrate is used for exerting an electric field to control a rotation degree of the liquid crystal material so as to carry out a display operation. In some examples, the liquid crystal display device further includes a backlight for providing backlight for the array substrate.

Another example of the display device is an organic electroluminescent display device (OLED), wherein, an organic light emitting material stacking layer is formed on an array substrate, and as a positive electrode or a negative electrode, a pixel electrode of each pixel unit is used for driving organic light emitting material to emit light, so as to implement a display operation.

Still another example of the display device is E-paper display device, wherein, an electronic-ink layer is formed on an array substrate, and a pixel electrode of each pixel unit is used for applying voltage to drive charged micro-particles in the electronic-ink to move, so as to implement a display operation.

The display device, for example, can be any product or component having a display function, such as a liquid crystal panel, electronic paper, a mobile phone, a tablet PC, a TV, a display, a notebook computer, a digital photo frame, a navigator, etc.

The display device in the embodiment has low production cost.

Although the present disclosure is described in detail hereinbefore with general illustration and embodiments, based on the present disclosure, certain amendments or improvements can be made thereto, which is obvious for those skilled in the art. Therefore, the amendments or improvements made to the present disclosure without departing from the spirit of the present disclosure should be within the scope of the present disclosure.

The present application claims priority of Chinese Patent Application No. 201610069573.9 filed on Feb. 1, 2016, the disclosure of which is incorporated herein by reference in its entirety as part of the present application.

The invention claimed is:

1. A fabrication method of a color filter substrate, comprising:
    forming a conductive pattern above an upper surface of a base substrate, the conductive pattern including two first electrode blocks arranged in a first direction, two second electrode blocks arranged in a second direction intersecting with the first direction, and a conductive connecting portion for connecting the two first electrode blocks;
    forming an interlayer insulating layer and a first color filter group above the conductive pattern, wherein, the first color filter group includes color filter(s) of at least one color, the interlayer insulating layer and the first color filter group are formed by a same material; and
    forming a conductive bridging portion for connecting the two second electrode blocks above the interlayer insulating layer, wherein, the interlayer insulating layer is configured to electrically insulate the conductive connecting portion from the conductive bridging portion.

2. The fabrication method of the color filter substrate according to claim 1, wherein, the interlayer insulating layer is disconnected from the first color filter group to expose the second electrode block at a disconnected position.

3. The fabrication method of the color filter substrate according to claim 2, further comprising forming a protruding portion and a second color filter group above the bridging portion, wherein, the second color filter group includes color filter(s) of at least one color, any one of the color filter(s) of the second color filter group and any one of the color filter(s) of the first color filter group are different in color, the protruding portion and the second color filter group are formed by a same material, and a vertical projection of the protruding portion on an upper surface of the base substrate at least partially overlaps with a vertical projection of the interlayer insulating layer on the upper surface of the base substrate.

4. The fabrication method of the color filter substrate according to claim 3, wherein, a sum of a number of colors of the color filter(s) of the first color filter group and the second color filter group is greater than or equal to 3.

5. The fabrication method of the color filter substrate according to claim 2, wherein, before forming the conductive pattern, the method further comprises:
    forming a pattern including a black matrix by a patterning process.

6. The fabrication method of the color filter substrate according to claim 2, wherein,
    the first electrode blocks are driving electrode blocks, and the second electrode blocks are sensing electrode blocks; or
    the first electrode blocks are sensing electrode blocks, and the second electrode blocks are driving electrode blocks.

7. The fabrication method of the color filter substrate according to claim 1, further comprising forming a protruding portion and a second color filter group above the bridging portion, wherein, the second color filter group includes color filter(s) of at least one color, any one of the color filter(s) of the second color filter group and any one of the color filter(s) of the first color filter group are different in color, the protruding portion and the second color filter group are formed by a same material, and a vertical projection of the protruding portion on an upper surface of the base substrate at least partially overlaps with a vertical projection of the interlayer insulating layer on the upper surface of the base substrate.

8. The fabrication method of the color filter substrate according to claim 7, wherein, a sum of a number of colors of the color filter(s) of the first color filter group and the second color filter group is greater than or equal to 3.

9. The fabrication method of the color filter substrate according to claim 1, wherein, before forming the conductive pattern, the method further comprises:
    forming a pattern including a black matrix by a patterning process.

10. The fabrication method of the color filter substrate according to claim 1, wherein,
    the first electrode blocks are driving electrode blocks, and the second electrode blocks are sensing electrode blocks; or
    the first electrode blocks are sensing electrode blocks, and the second electrode blocks are driving electrode blocks.

11. A color filter substrate, comprising:
    a base substrate;
    a conductive pattern located above an upper surface of the base substrate, including two first electrode blocks arranged in a first direction, two second electrode blocks arranged in a second direction intersecting with the first direction, and a conductive connecting portion for connecting the two first electrode blocks;
    an interlayer insulating layer and a first color filter group located above the conductive pattern, wherein, the first color filter group includes color filter(s) of at least one color, the interlayer insulating layer and the first color filter group are formed by a same material; and
    a conductive bridging portion located above the interlayer insulating layer and configured for connecting the two second electrode blocks, wherein, the interlayer insulating layer is configured to electrically insulate the conductive connecting portion from the conductive bridging portion.

12. The color filter substrate according to claim 11, wherein, the interlayer insulating layer is disconnected from the first color filter group to expose the second electrode block at a disconnected position.

13. The color filter substrate according to claim 12, further comprising a protruding portion and a second color filter group located above the bridging portion, wherein, the second color filter group includes color filter(s) of at least one color, any one of the color filter(s) of the second color filter group and any one of the color filter(s) of the first color filter group are different in color, the protruding portion and the second color filter group are formed by a same material, and a vertical projection of the protruding portion on an upper surface of the base substrate at least partially overlaps with a vertical projection of the interlayer insulating layer on the upper surface of the base substrate.

14. The color filter substrate according to claim 13, wherein, a sum of a number of colors of the color filter(s) of the first color filter group and the second color filter group is greater than or equal to 3.

15. The color filter substrate according to claim 12, further comprising a black matrix layer located between the substrate and the conductive connecting portion.

16. The color filter substrate according to claim 11, further comprising a protruding portion and a second color filter group located above the bridging portion, wherein, the second color filter group includes color filter(s) of at least one color, any one of the color filter(s) of the second color filter group and any one of the color filter(s) of the first color filter group are different in color, the protruding portion and the second color filter group are formed by a same material, and a vertical projection of the protruding portion on an upper surface of the base substrate at least partially overlaps with a vertical projection of the interlayer insulating layer on the upper surface of the base substrate.

17. The color filter substrate according to claim 16, wherein, a sum of a number of colors of the color filter(s) of the first color filter group and the second color filter group is greater than or equal to 3.

18. The color filter substrate according to claim 11, further comprising a black matrix layer located between the substrate and the conductive connecting portion.

19. The color filter substrate according to claim 11, wherein,
    the first electrode blocks are driving electrode blocks, and the second electrode blocks are sensing electrode blocks; or
    the first electrode blocks are sensing electrode blocks, and the second electrode blocks are driving electrode blocks.

20. A display device, comprising the color filter substrate according to claim 11.

* * * * *